(12) United States Patent
Wang et al.

(10) Patent No.: US 9,755,033 B2
(45) Date of Patent: Sep. 5, 2017

(54) SEMICONDUCTOR DEVICE AND METHOD OF FORMING VERTICAL STRUCTURE

(71) Applicant: Taiwan Semiconductor Manufacturing Company Limited, Hsinchu (TW)

(72) Inventors: Chih-Hao Wang, Hsinchu County (TW); Wai-Yi Lien, Hsinchu (TW); Shi-Ning Ju, Hsinchu (TW); Kai-Chieh Yang, Hsinchu County (TW); Wen-Ting Lan, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 222 days.

(21) Appl. No.: 14/303,744

(22) Filed: Jun. 13, 2014

(65) Prior Publication Data

US 2015/0364560 A1 Dec. 17, 2015

(51) Int. Cl.
*H01L 29/66* (2006.01)
*H01L 29/423* (2006.01)
(Continued)

(52) U.S. Cl.
CPC .. *H01L 29/42392* (2013.01); *H01L 21/31053* (2013.01); *H01L 21/31144* (2013.01); *H01L 21/823487* (2013.01); *H01L 21/823885* (2013.01); *H01L 29/66666* (2013.01); *H01L 29/7827* (2013.01)

(58) Field of Classification Search
CPC ........... H01L 29/7827; H01L 29/66666; H01L 29/42392; H01L 29/7926; H01L 29/78642; H01L 21/823487; H01L 21/823885; H01L 21/31055; H01L 21/31144; H01L 21/02233; H01L 21/324
See application file for complete search history.

(56) References Cited

U.S. PATENT DOCUMENTS 8,373,226 B2 * 2/2013 Taketani ......... H01L 21/823431
257/296
8,716,156 B1 5/2014 Pawlak et al.
(Continued)

FOREIGN PATENT DOCUMENTS

JP 2009188415 8/2009
JP 2013045901 3/2013
(Continued)

OTHER PUBLICATIONS

Korean Notice of Allowance; Application No. 10-2014-0182418; dated Jul. 15, 2016.
(Continued)

*Primary Examiner* — Michael Trinh
(74) *Attorney, Agent, or Firm* — McDermott Will & Emery LLP

(57) ABSTRACT

According to an exemplary embodiment, a method of forming a vertical structure is provided. The method includes the following operations: providing a substrate; providing the vertical structure having a source, a channel, and a drain over the substrate; shrinking the source and the channel by oxidation; forming a metal layer over the drain of the vertical structure; and annealing the metal layer to form a silicide over the drain of the vertical structure.

20 Claims, 22 Drawing Sheets

(51) Int. Cl.
*H01L 29/78* (2006.01)
*H01L 21/311* (2006.01)
*H01L 21/8238* (2006.01)
*H01L 21/3105* (2006.01)
*H01L 21/8234* (2006.01)

(56) References Cited

U.S. PATENT DOCUMENTS

| | | | |
|---|---|---|---|
| 2009/0289292 A1 | 11/2009 | Park | |
| 2011/0303973 A1* | 12/2011 | Masuoka | H01L 21/823885 257/329 |
| 2012/0088343 A1* | 4/2012 | Son | B82Y 10/00 438/239 |
| 2012/0112270 A1 | 5/2012 | Park et al. | |
| 2012/0319201 A1* | 12/2012 | Sun | H01L 21/823487 257/338 |
| 2013/0273703 A1* | 10/2013 | Masuoka | H01L 21/823885 438/268 |
| 2014/0167146 A1* | 6/2014 | Kang | H01L 29/7391 257/329 |

FOREIGN PATENT DOCUMENTS

| | | |
|---|---|---|
| KR | 20130142521 | 12/2013 |
| TW | 2011008418 | 3/2011 |
| TW | 201112354 | 4/2011 |
| WO | 2013/095384 | 6/2013 |

OTHER PUBLICATIONS

Korean Office Action; Application No. 10-2014-0182418; dated Dec. 9, 2015.
Taiwanese Office Action; Application No. 104112812; dated Mar. 15, 2016.

* cited by examiner

SEMICONDUCTOR DEVICE AND METHOD OF FORMING VERTICAL STRUCTURE

BACKGROUND

Vertical semiconductor devices, such as vertical gate-all-around transistors, are an emerging research area in the semiconductor industry. However, in vertical devices, the contact resistance of a source/drain parasitic resistance degrades device performance, especially in high-speed applications. Therefore, there is a need to improve the above deficiency.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1:
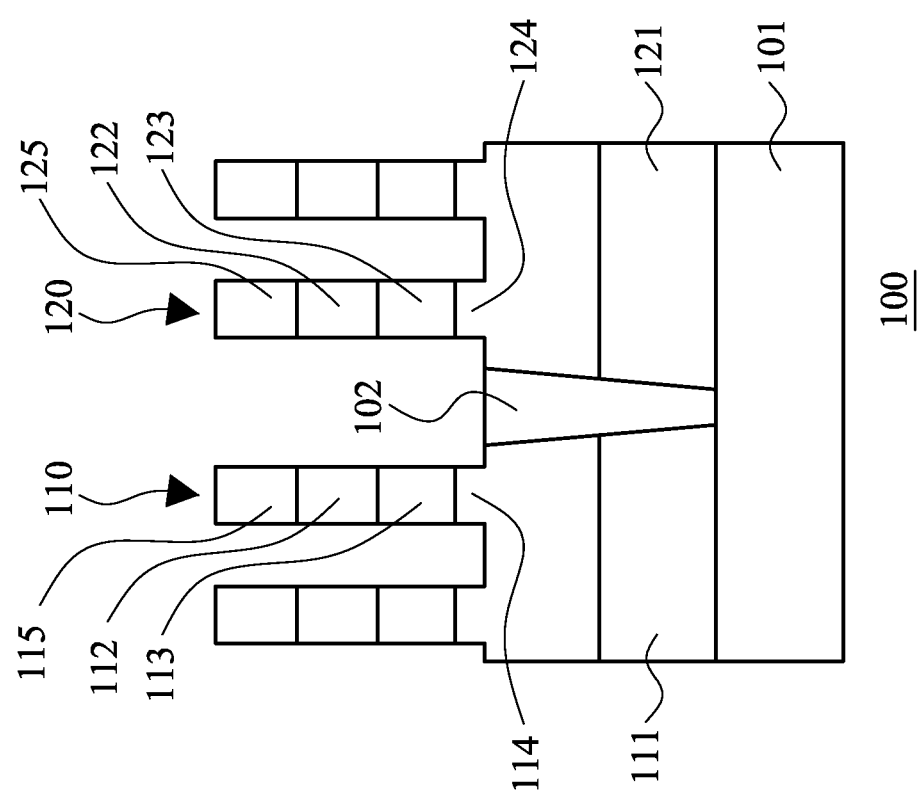
FIGS. 1-6 are sectional views illustrating an exemplary semiconductor device in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The disclosure describes a method of forming a vertical structure having a drain, a source, and a channel. The method may include: removing a dielectric (e.g. SiN or oxide) adjacent to a top and a portion of a sidewall of the drain to make the drain protrude from the dielectric; forming a metal layer over the top and a portion of the sidewall of the drain; and annealing the metal layer to form a silicide over the top and the portion of the sidewall of the drain. The method provides a larger contact area between the drain and the silicides compared to prior methods. Therefore, the method may reduce contact resistance of the drain parasitic resistance to enhance device performance because the contact resistance is inversely proportional to the contact area between the drain and the silicides. From our simulation results, it is observed that a transistor formed by using the method has an improvement on saturation current (+3.4%) and linear current (+127%) compared to prior methods.

The disclosure describes another method of forming a vertical structure having a drain, a source, and a channel. The method may include: shrinking the source and the channel by oxidation to make the width of the drain greater than those of the source and the channel; forming a metal layer over the drain of the vertical structure; and annealing the metal layer to form a silicide over the drain of the vertical structure. In the method, each of the source and the channel has about the same diameter or width of, for example, about 4-10 nanometers while the drain has a diameter or width of, for example, about 10-20 nanometers. The drain having the width greater than those of the source and the channel may refer to a "big head", and the source and the channel may refer to a "slim body". The method provides a "big head" drain with a larger contact area between the drain and the silicides compared to prior methods. Therefore, the method may reduce contact resistance of the drain parasitic resistance to enhance device performance because the contact resistance is inversely proportional to the contact area between the drain and the silicides.

In the embodiment, each of the drain, the source, and the channel has about the same diameter or width of, for example, about 4-10 nanometers. The method is applicable at least to Si/SiGe/Ge/III-V vertical gate all around devices. Additionally, the material of the silicide for the drain may be different from that for the source.

In addition, the drain may refer to a region that has been treated as a drain, or a region that has not been treated but to be treated as a drain. The source may refer to a region that has been treated as a source, or a region that has not been treated but to be treated as a source. The channel may refer to a region that has been treated as a channel, or a region that has not been treated but to be treated as a channel.

FIG. 1 is a sectional view illustrating an exemplary semiconductor device in accordance with some embodiments. As shown in FIG. 1, a semiconductor device 100 is provided. In the semiconductor device 100, a first vertical structure 110 and a second vertical structure 120 are provided over a substrate 101. The first vertical structure 110 and the second vertical structure 120 may be vertical-gate-all-around devices electrically isolated by shallow trench isolation 102. The first vertical structure 110 may be an NMOS and may include a p-well 111, a first source 114, a first channel 113, and a first drain 112. The second vertical structure 120 may be a PMOS, and may include an n-well 121, a second source 124, a second channel 123, and a second drain 122. The selection of the first vertical structure 110 and second vertical structure 120 as, respectively, PMOS and NMOS is an arbitrary choice made for purposes of illustration. Those skilled in the art upon reading this disclosure would appreciate that other options are available.

The first source 114 is disposed over the p-well 111. The first channel 113 is disposed over the first source 114. The first drain 112 is disposed over the first channel 113. The second source 124 is disposed over the n-well 121. The second channel 123 is disposed over the second source 124. The second drain 122 is disposed over the second channel 123. The following procedures may be performed on the first vertical structure 110 and the second vertical structure 120, so will only be discussed below with respect to the first vertical structure 110. Additionally, hard masks 115, 125 are formed over the drains 112, 122 respectively for protection. In the embodiment, each of the first source 114, the first channel 113, and the first drain 112 has about the same diameter or width of, for example, about 10-20 nanometers.

In one embodiment, the substrate 101 includes a crystalline silicon substrate. In some alternative embodiments, the substrate 101 may be made of some other suitable elemental semiconductor, such as diamond or germanium; a suitable compound semiconductor, such as gallium arsenide, silicon carbide, indium arsenide, or indium phosphide; or a suitable alloy semiconductor, such as silicon germanium carbide, gallium arsenic phosphide, or gallium indium phosphide. Further, the substrate 101 may include an epitaxial layer (epi-layer), may be strained for performance enhancement, and/or may include a silicon-on-insulator (SOI) structure.

Figure 2:
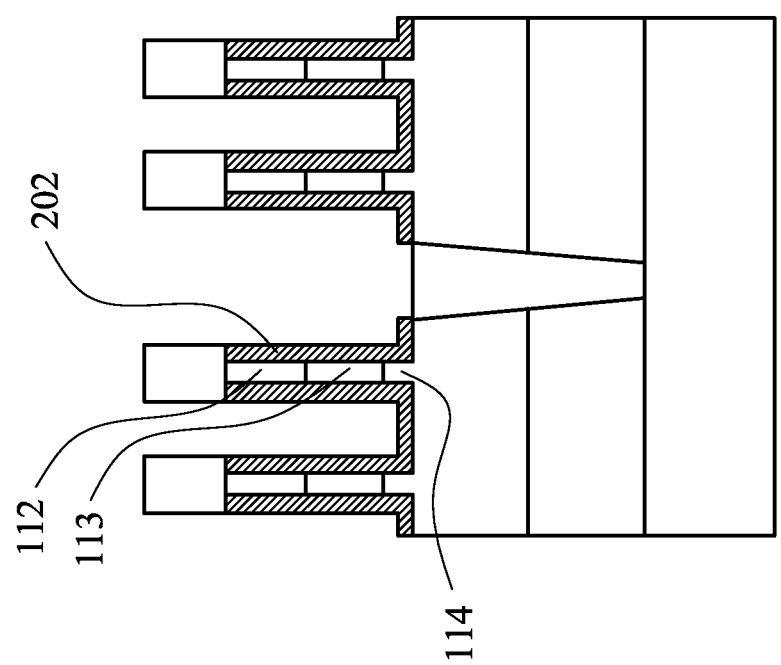

FIG. 2 is a sectional view illustrating the exemplary semiconductor device in accordance with some embodiments. As shown in FIG. 2, oxidation process, for example, such as an in-situ steam generation (ISSG) process, is performed on the first source 114, the first channel 113, and the first drain 112 so as to grow an oxide portion 202.

Figure 3:
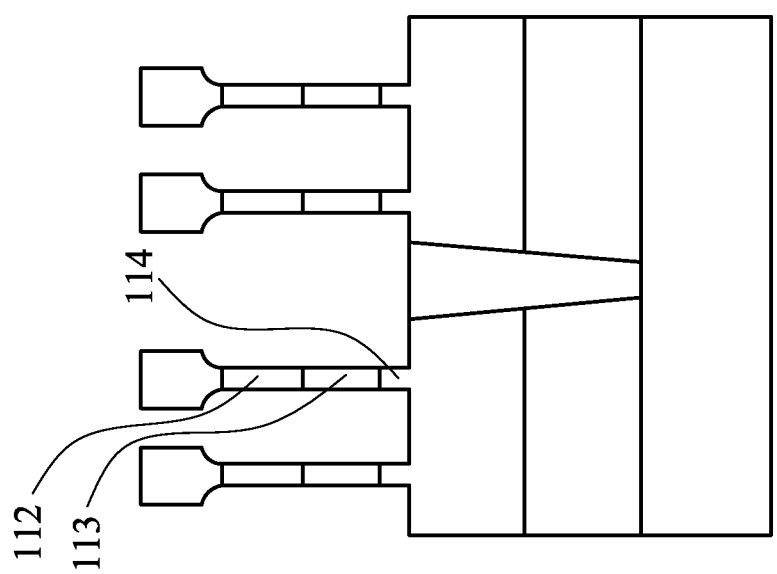

FIG. 3 is a sectional view illustrating the exemplary semiconductor device in accordance with some embodiments. As shown in FIG. 3, the oxide portion 202 over the first source 114, the first channel 113, and the first drain 112 are removed by plasma etching. In the embodiment, each of the first source 114, the first channel 113, and the first drain 112 has the same diameter or width of, for example, about 4-10 nanometers. Plasma etching refers to the removal of material, typically a masked pattern of semiconductor material, by exposing the material to a bombardment of ions (usually a plasma of reactive gases such as fluorocarbons, oxygen, chlorine, boron trichloride; sometimes with addition of nitrogen, argon, helium and other gases) that dislodge portions of the material from the exposed surface.

Figure 4:
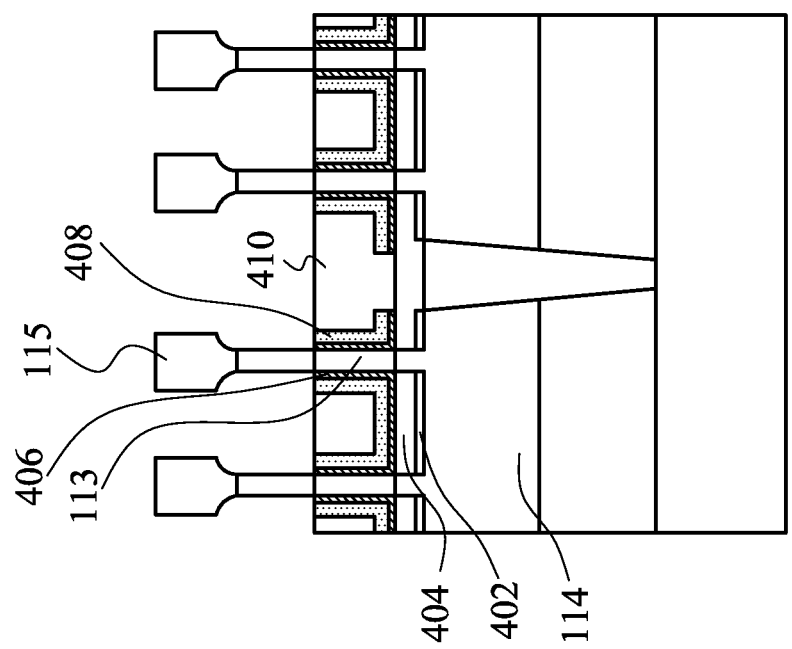

FIG. 4 is a sectional view illustrating the exemplary semiconductor device in accordance with some embodiments. As shown in FIG. 4, a silicide 402 is formed over the first source 114. A first interlayer dielectric 404 is formed over the first source 114. A high-k dielectric layer 406 is formed over the first channel 113. A metal gate layer 408 is formed over the high-k dielectric layer 406. A second interlayer dielectric 410 is formed over the metal gate layer 408. High-k dielectrics may comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

Figure 5:
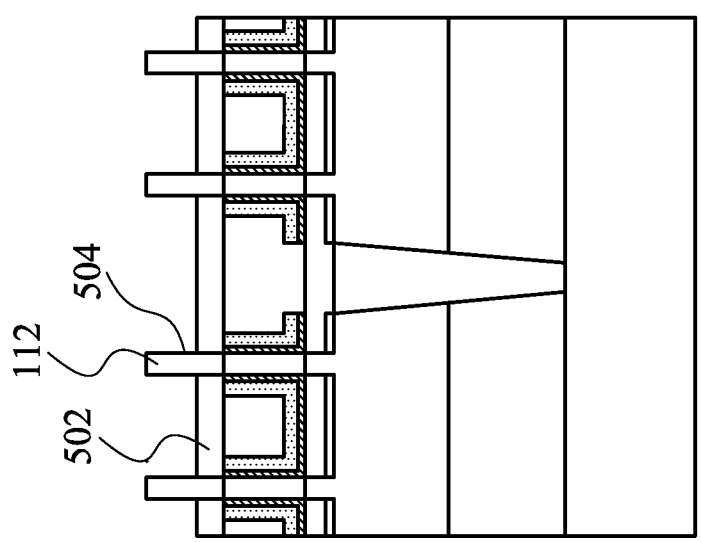

FIG. 5 is a sectional view illustrating the exemplary semiconductor device in accordance with some embodiments. As shown in FIGS. 4 and 5, the hard mask 115 is removed by a chemical polishing process. After that, an etch stop layer 502 is formed to cover a portion of a sidewall 504 of the first drain 112. One embodiment for formation of the etch stop layer 502 includes: first to deposit the etch stop layer 502; then to etch back the etch stop layer 502 to expose an upper portion of the first drain 112. The etch stop layer 502 may be made of, for example, SiN.

Figure 6:
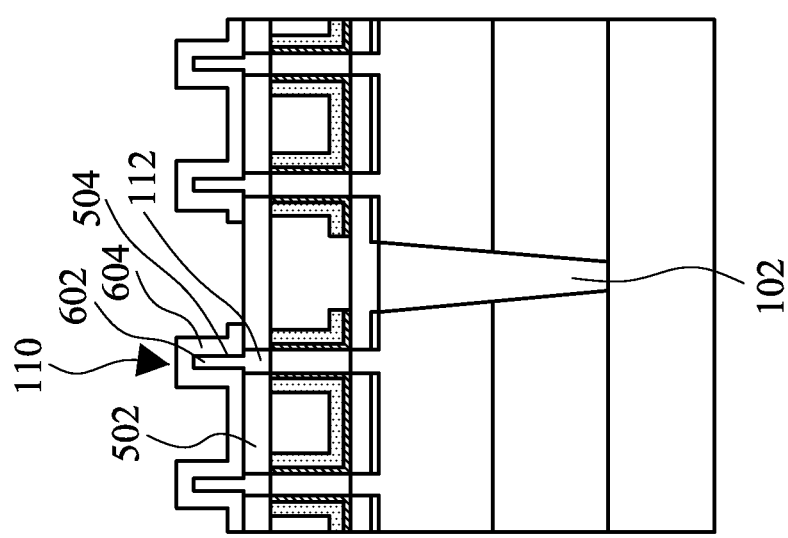

FIG. 6 is a sectional view illustrating the exemplary semiconductor device in accordance with some embodiments. As shown in FIG. 6, a silicide 604 is formed over a top 602 and the sidewall 504 of the first drain 112. One embodiment for formation of the silicide 604 includes: to form an amorphous silicon layer (not shown) over the etch stop layer 502, and the top 602 and the sidewall 504 of the first drain 112; to deposit a metal layer (not shown) over the amorphous silicon layer; to anneal the metal layer to form the silicide 604 over the top 602 and the sidewall 504 of the first drain 112. In some embodiments, the metal layer is formed over an upper portion of the sidewall 504. Moreover, the silicide 604 over the STI 102 is removed. In the embodiment, the silicide 604 connects the first drain 112 of the first vertical structure 110 to a drain of the vertical structure on its left.

The method provides a larger contact area between the first drain 112 and the silicide 604 compared to prior methods. Therefore, the method may reduce contact resistance of the drain parasitic resistance to enhance device performance because the contact resistance is inversely proportional to the contact area between the first drain 112 and the silicide 604. From our simulation results, it is observed that a transistor formed by using the method has an improvement on saturation current (+3.4%) and linear current (+127%) compared to prior methods.

Figure 7:
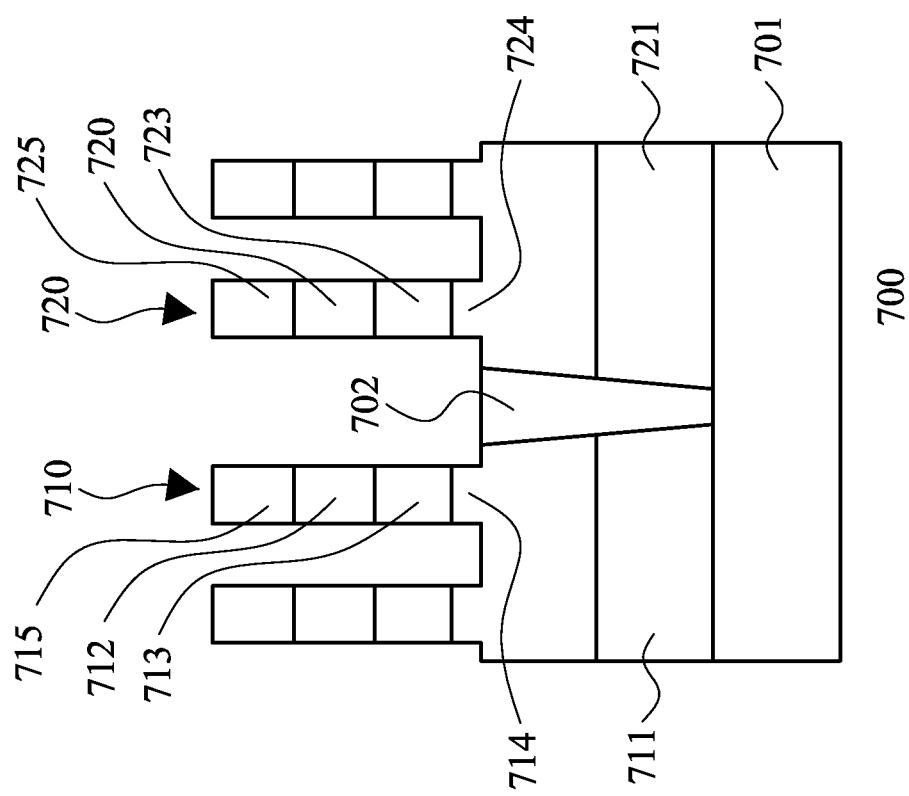
FIGS. 7-18 are sectional views illustrating another exemplary semiconductor device in accordance with some embodiments.

FIG. 7 is a sectional view illustrating an exemplary semiconductor device in accordance with some embodiments. As shown in FIG. 7, a semiconductor device 700 is provided. In the semiconductor device 700, a first vertical structure 710 and a second vertical structure 720 are provided over a substrate 701. The first vertical structure 710 and the second vertical structure 720 may be vertical-gate-all-around devices electrically isolated by shallow trench isolation 702. The first vertical structure 710 may be a NMOS and may include a p-well 711, a first source 714, a first channel 713, and a first drain 712. The second vertical structure 720 may be a PMOS, and may include an n-well 721, a second source 724, a second channel 723, and a second drain 722. The selection of the first vertical structure 710 and second vertical structure 720 as, respectively, PMOS and NMOS is an arbitrary choice made for purposes of illustration. Those skilled in the art upon reading this disclosure would appreciate that other options are available.

The first source 714 is disposed over the p-well 711. The first channel 713 is disposed over the first source 714. The first drain 712 is disposed over the first channel 713. The second source 724 is disposed over the n-well 721. The second channel 723 is disposed over the second source 724. The second drain 722 is disposed over the second channel 723. The following procedures may be performed on the first vertical structure 710 and the second vertical structure 720, so will only be discussed below with respect to the first vertical structure 710. Additionally, hard masks 715, 725 are formed over the drains 712, 722 respectively for protection. In the embodiment, each of the first source 714, the first channel 713, and the first drain 712 has the same diameter or width of, for example, about 10-20 nanometers.

Figure 8:
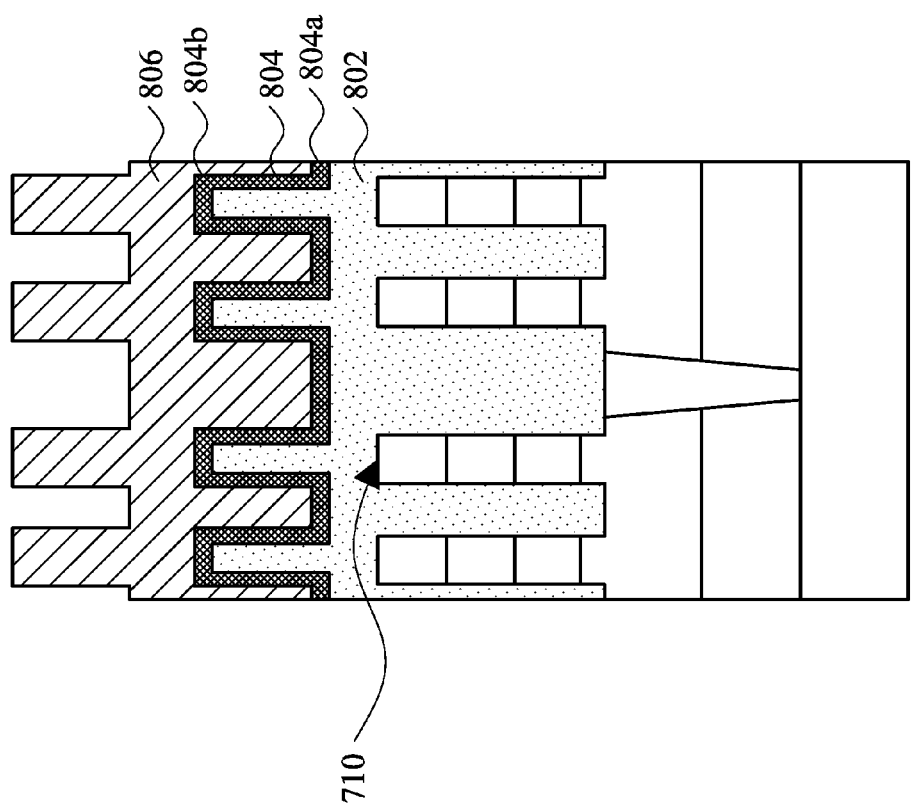

FIG. 8 is a sectional view illustrating the exemplary semiconductor device in accordance with some embodiments. As shown in FIG. 8, a first oxide layer 802 is formed over the first vertical structure 710. A nitride layer 804 is formed over the first oxide layer 802. A second oxide layer 806 is formed over the nitride layer 804. The first oxide layer 802, the nitride layer 804, and the second oxide layer 806 form a three layer sandwich structure of ONO (oxide/nitride/oxide layers). The first oxide layer 802 may be formed of, for example, flowable oxide; the nitride layer 804 may be formed of, for example, SiN; and the second oxide layer 806 may be formed of, for example, Plasma enhanced oxide (PE oxide). The nitride layer 804 may have a thickness of 50-100 angstroms.

Moreover, the portion 804b of the nitride layer 804 refers to a upper portion which corresponds to hard masks of the vertical structures; the portion 804a of the nitride layer 804 refers to a lower portion which corresponds to underlying areas without the hard masks. Generally, the areas covered with the hard masks are less than 10% of the entire die so that the portion 804b of the nitride layer 804 is more vulnerable to chemical polishing process than is the portion 804a of the nitride layer 804.

Figure 9:
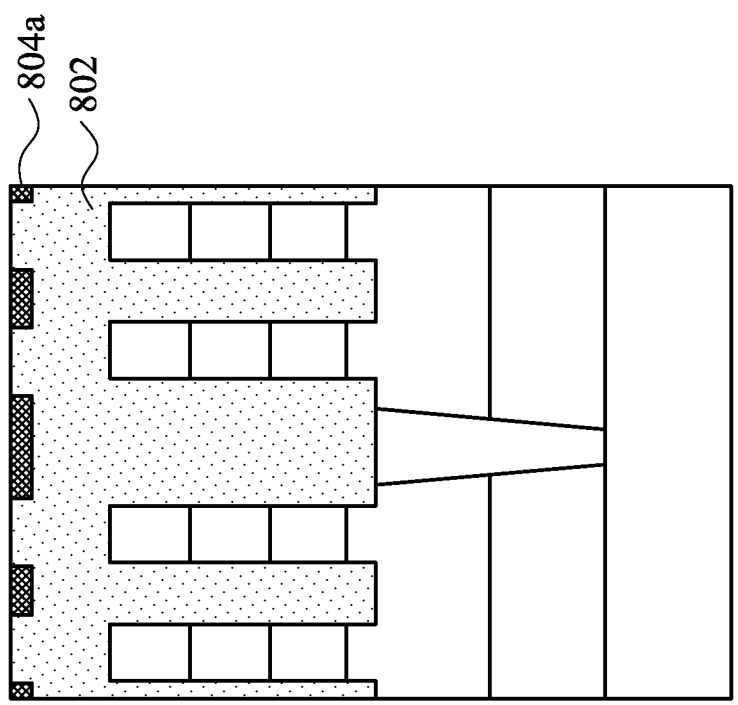

FIG. 9 is a sectional view illustrating the exemplary semiconductor device in accordance with some embodiments. As shown in FIGS. 8 and 9, a chemical polishing process is performed on the first oxide layer 802, the nitride layer 804, and the second oxide layer 806, and stops on the portion 804a of the nitride layer 804.

Figure 10:
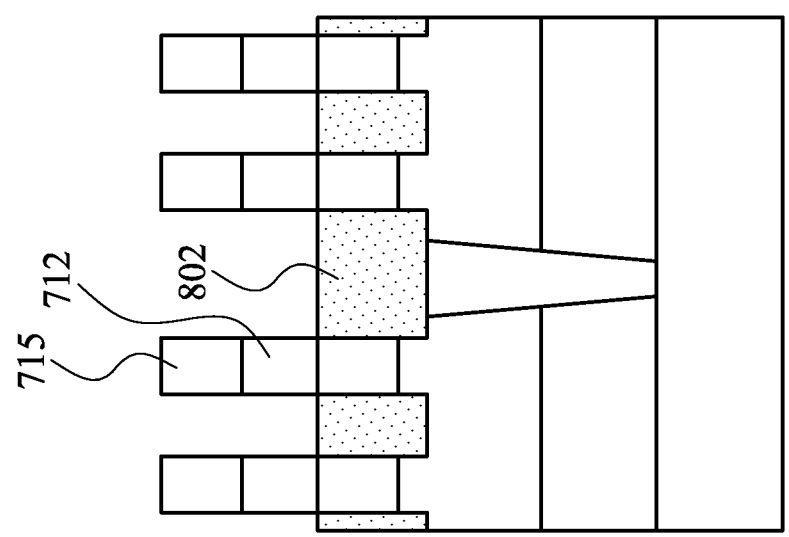

FIG. 10 is a sectional view illustrating the exemplary semiconductor device in accordance with some embodiments. As shown in FIGS. 9 and 10, the portion 804a of the nitride layer 804 and the first oxide layer 802 are etched to expose the first drain 712 and the hard mask 715 by using plasma etching and an etch-back process.

Figure 11:
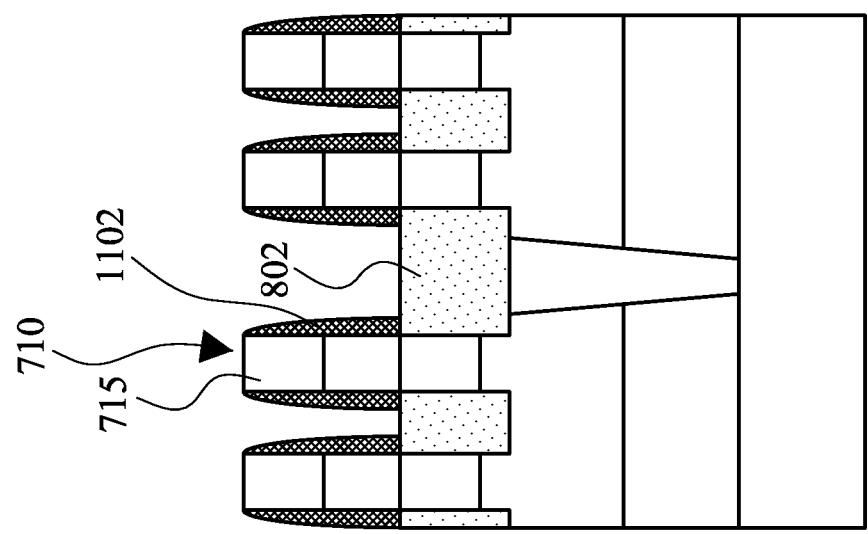

FIG. 11 is a sectional view illustrating the exemplary semiconductor device in accordance with some embodiments. As shown in FIG. 11, a dielectric layer 1102 is conformally formed over the first oxide layer 802, the first vertical structure 710 by using, for example, atomic layer deposition (ALD). The conformal dielectric layer 1102 is a dielectric material layer that includes a dielectric material such as silicon oxide, silicon nitride, silicon oxynitride, a dielectric metal oxide, a dielectric metal nitride, a dielectric oxynitride, or a combination thereof. In one embodiment, the conformal dielectric layer 1102 can have a same thickness in vertical portions as in horizontal portions. Moreover, the dielectric layer 1102 is etched to expose a portion of first oxide layer 802 by using plasma etching. The dielectric layer 1102 is anisotropically etched in an anisotropic etch process. The hard mask 715 of the first vertical structures 710 is exposed after the anisotropic etching. The dielectric layer 1102 adjacent to the first drain 712 is formed as a spacer for protection of the first drain 712.

Figure 12:
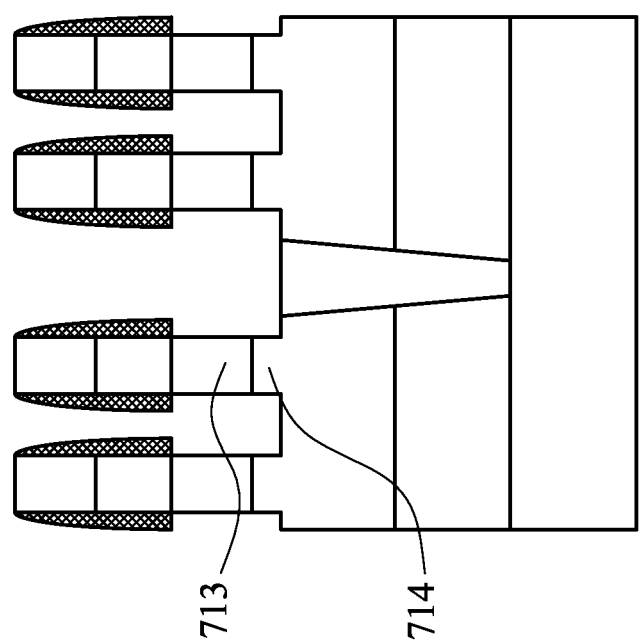

FIG. 12 is a sectional view illustrating an exemplary semiconductor device in accordance with some embodiments. As shown in FIGS. 11 and 12, the first oxide layer 802 over the first source 714 and the first channel 713 are removed by plasma etching.

Figure 13:
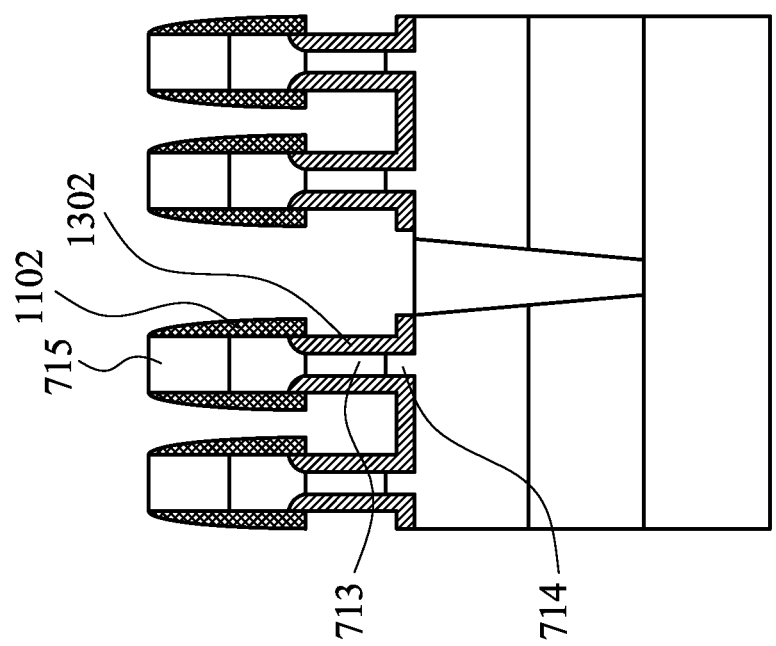

FIG. 13 is a sectional view illustrating the exemplary semiconductor device in accordance with some embodiments. As shown in FIG. 13, oxidation process, for example, such as an in-situ steam generation (ISSG) process, is performed on the first source 714 and the first channel 713 so as to grow an oxide portion 1302 and to shrink the first source 714 and the first channel 713 substantially without shrinking the first drain 712 covered by the hard mask 715 and the spacer 1102.

Figure 14:
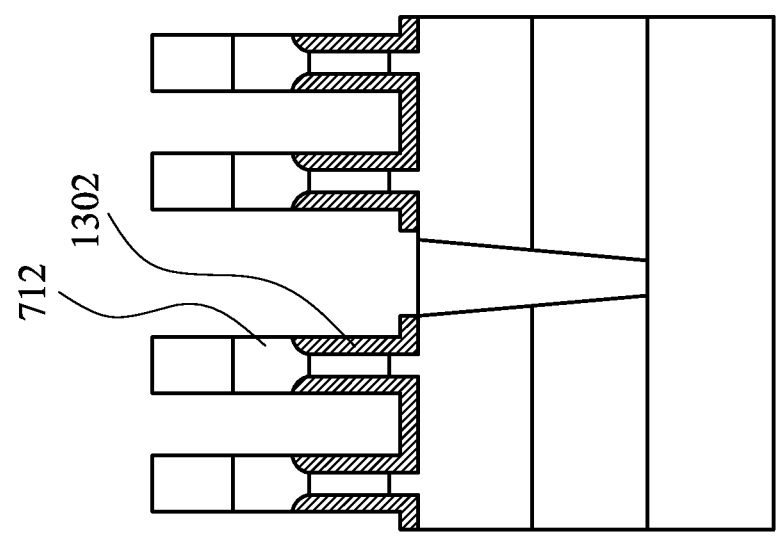

FIG. 14 is a sectional view illustrating an exemplary semiconductor device in accordance with some embodiments. As shown in FIGS. 13 and 14, the spacer 1102 over the first drain 712 is removed by plasma etching with orthophosphoric acid.

Figure 15:
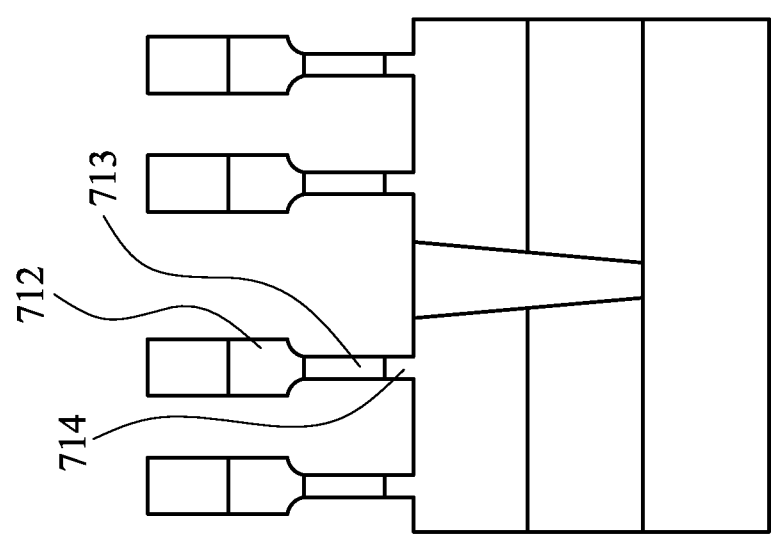

FIG. 15 is a sectional view illustrating the exemplary semiconductor device in accordance with some embodiments. As shown in FIGS. 14 and 15, the oxide portion 1302 over the first source 714 and the first channel 713 are removed by plasma etching. In the embodiment, each of the first source 714 and the first channel 713 has about the same diameter or width of, for example, about 4-10 nanometers while the first drain 712 has a diameter or width of, for example, about 10-20 nanometers. The first drain 712 having the width greater than those of the first source 714 and the first channel 713 may refer to a "big head", and the first source 714 and the first channel 713 may refer to a "slim body".

Figure 16:
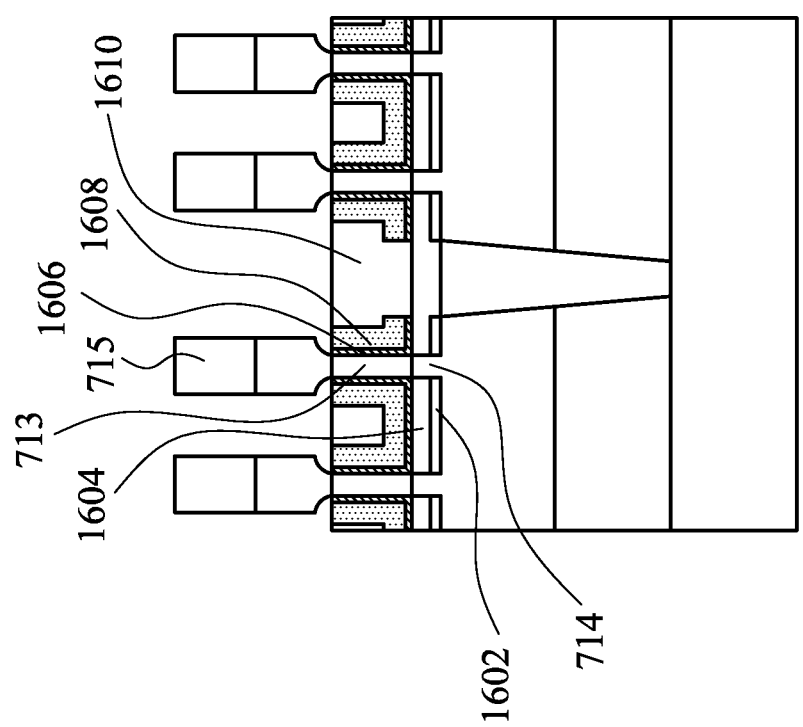

FIG. 16 is a sectional view illustrating the exemplary semiconductor device in accordance with some embodiments. As shown in FIG. 16, a silicide 1602 is formed over the first source 714. A first interlayer dielectric 1604 is formed over the first source 714. A high-k dielectric layer 1606 is formed over the first channel 713. A metal gate layer 1608 is formed over the high-k dielectric layer 1606. A second interlayer dielectric 1610 is formed over the metal gate layer 1608. High-k dielectrics may comprise metal oxides. Examples of metal oxides used for high-k dielectrics include oxides of Li, Be, Mg, Ca, Sr, Sc, Y, Zr, Hf, Al, La, Ce, Pr, Nd, Sm, Eu, Gd, Tb, Dy, Ho, Er, Tm, Yb, Lu and mixtures thereof.

Figure 17:
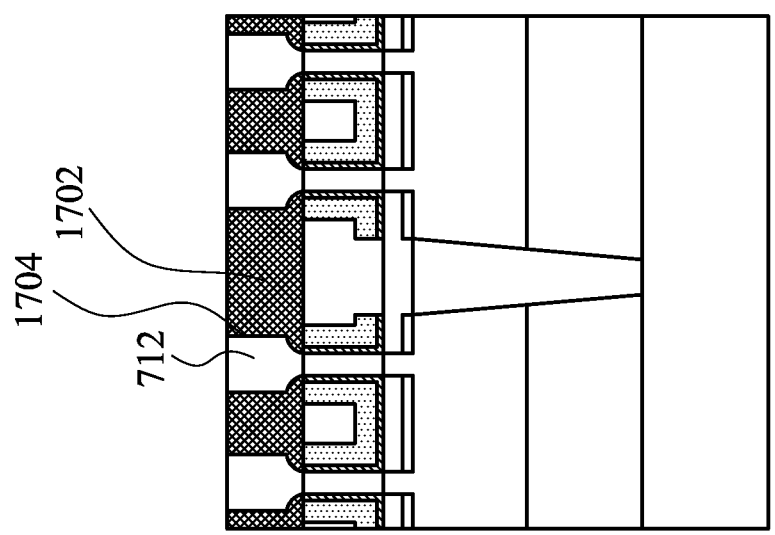

FIG. 17 is a sectional view illustrating the exemplary semiconductor device in accordance with some embodiments. As shown in FIGS. 16 and 17, the hard mask 715 is removed by a chemical polishing process. After that, an etch stop layer 1702 is formed to cover a sidewall 1704 of the first drain 712. The etch stop layer 1702 may be made of, for example, SiN.

Figure 18:
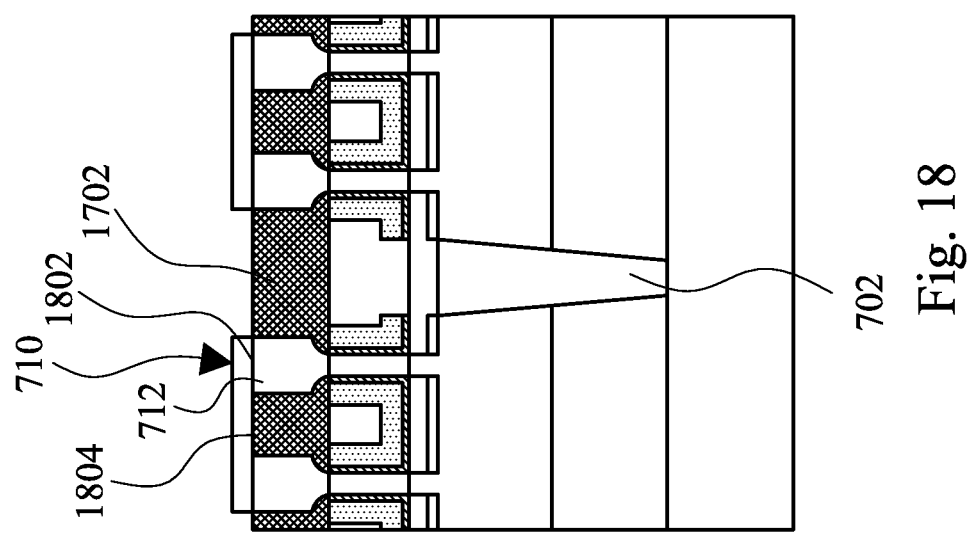

FIG. 18 is a sectional view illustrating the exemplary semiconductor device in accordance with some embodiments. As shown in FIG. 18, a silicide 1804 is formed over a top 1802 of the first drain 712. One embodiment for formation of the silicide 1804 includes: to form an amorphous silicon layer (not shown) over the etch stop layer 1702, and the top 1802 of the first drain 712; to deposit a metal layer (not shown) over the amorphous silicon layer; to anneal the metal layer to form the silicide 1804 over the top 1802 of the first drain 712. Moreover, the silicide 1804 over the STI 702 is removed. In the embodiment, the silicide 1804 connects the first drain 712 of the first vertical structure 710 to a drain of the vertical structure on its left.

The method provides a "big head" drain with a larger contact area between the first drain 712 and the silicide 1804 compared to prior methods. Therefore, the method may reduce contact resistance of the drain parasitic resistance to enhance device performance because the contact resistance is inversely proportional to the contact area between the first drain 712 and the silicide 1804.

Figure 19:
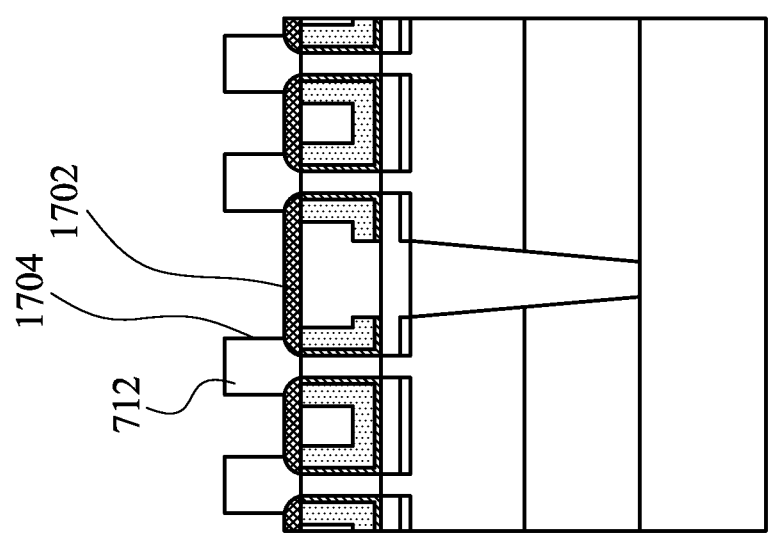
FIGS. 19-20 are sectional views illustrating another exemplary semiconductor device in accordance with some embodiments.

There is another embodiment combining the benefits in the abovementioned disclosure. FIG. 19 is a sectional view illustrating another exemplary semiconductor device in accordance with some embodiments. Continuing from FIG. 17, as shown in FIG. 19, the hard mask 715 is removed by a chemical polishing process. After that, an etch stop layer 1702 is formed to cover a portion of a sidewall 1704 of the first drain 712. One embodiment for formation of the etch stop layer 1702 includes: first to deposit the etch stop layer 1702; then to etch back the etch stop layer 1702 to expose an upper portion of the first drain 712. The etch stop layer 1702 may be made of, for example, SiN.

Figure 20:
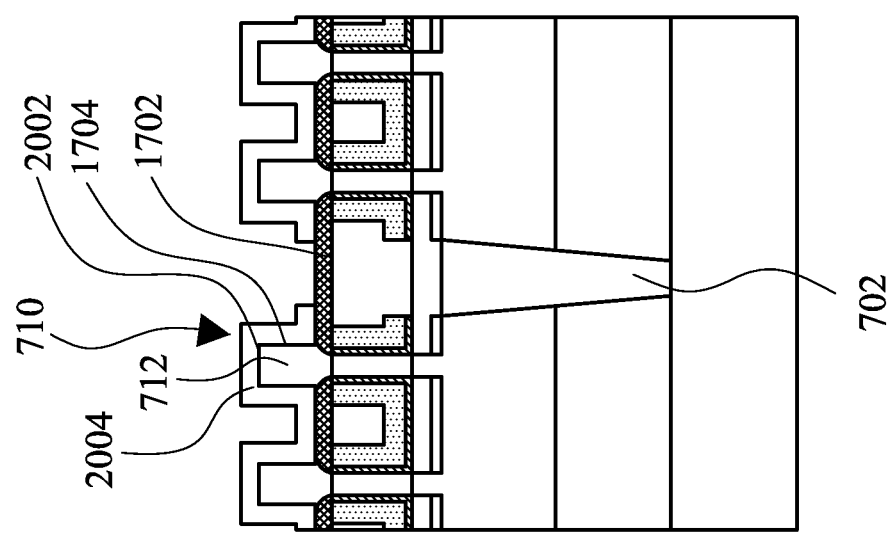

FIG. 20 is a sectional view illustrating the exemplary semiconductor device in accordance with some embodiments. As shown in FIG. 20, a silicide 2004 is formed over a top 2002 and the sidewall 1704 of the first drain 712. One embodiment for formation of the silicide 2004 includes: to form an amorphous silicon layer (not shown) over the etch stop layer 1702, and the top 2002 and the sidewall 1704 of the first drain 712; to deposit a metal layer (not shown) over the amorphous silicon layer; to anneal the metal layer to form the silicide 2004 over the top 2002 and the sidewall 1704 of the first drain 712. In some embodiments, the metal layer is formed over a upper portion of the sidewall 1704. Moreover, the silicide 2004 over the STI 702 is removed. In the embodiment, the silicide 2004 connects the first drain 712 of the first vertical structure 710 to a drain of the vertical structure on its left.

The method provides a larger contact area between the first drain 712 and the silicide 2004 compared to prior methods. The method also provides a "big head" drain with a larger contact area between the first drain 712 and the silicide 2004 compared to prior methods. Therefore, the method may reduce contact resistance of the drain parasitic resistance to enhance device performance because the contact resistance is inversely proportional to the contact area between the first drain 712 and the silicide 2004.

Figure 21:
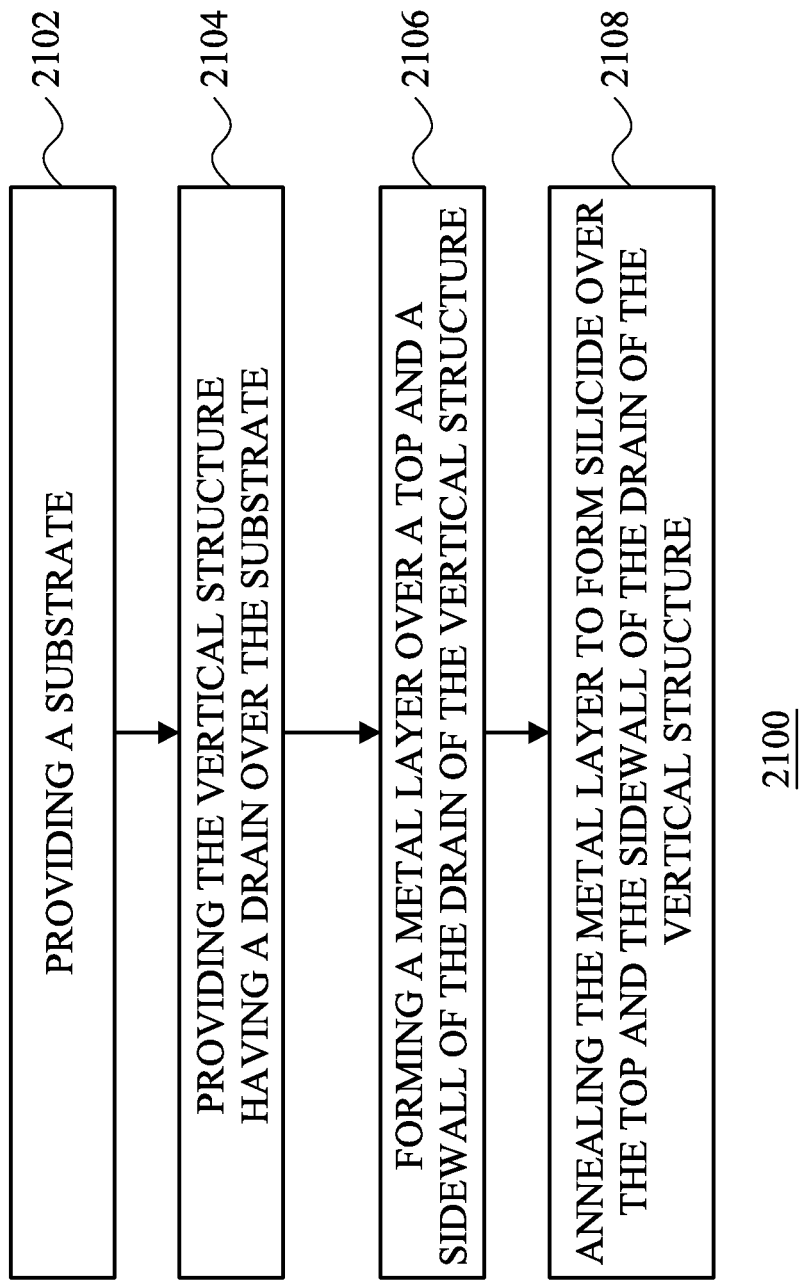
FIG. 21 is a flow chart for a method forming a vertical structure in accordance with some embodiments.

FIG. 21 is a flow chart for a method of forming a vertical structure. As shown in FIG. 21, a method 2100 is provided. The method 2100 includes the following operations: providing a substrate (2102); providing the vertical structure having a drain over the substrate (2104); forming a metal layer over a top and a sidewall of the drain of the vertical structure (2106); and annealing the metal layer to form silicide over the top and the sidewall of the drain of the vertical structure (2108).

The operation 2104 may further include providing the vertical structure having a source, a channel, and the drain. The method 2100 may further include: shrinking the source, the channel, and the drain by oxidation; removing oxidized portions of the source, the channel, and the drain; forming silicide over the source; forming a first interlayer dielectric over the source; forming a high-k dielectric layer over the channel; forming a metal gate layer over the high-k dielectric layer; forming a second interlayer dielectric over the metal gate layer; and forming an etch stop layer to cover a portion of the sidewall of the drain. The operation of forming the etch stop layer to cover the portion of the sidewall of the drain may further include: forming the etch stop layer over the sidewall of the drain; and etching back the etch stop layer to expose a portion of the sidewall of the drain.

The operation of shrinking the source, the channel, and the drain by oxidation may further include shrinking the source, the channel, and the drain to have a same width of about 4-10 nanometers. The operation of forming the metal layer over the top and the sidewall of the drain of the vertical structure further include forming the metal layer over a upper portion of the sidewall of the drain of the vertical structure.

Figure 22:
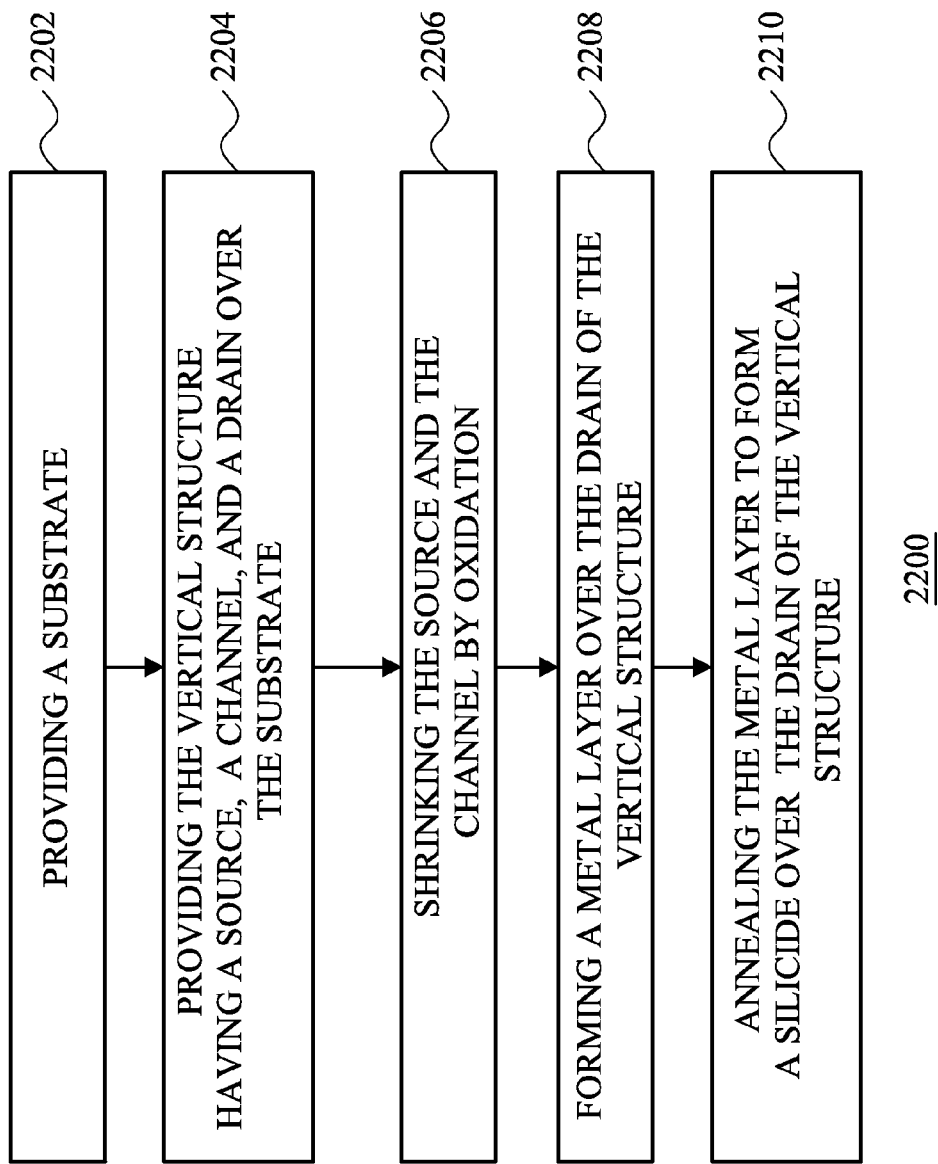
FIG. 22 is a flow chart for a method forming a vertical structure in accordance with some embodiments.

FIG. 22 is a flow chart for a method of forming a vertical structure. As shown in FIG. 22, a method 2200 is provided. The method 2200 includes the following operations: providing a substrate (2202); providing the vertical structure having a source, a channel, and a drain over the substrate (2204); shrinking the source and the channel by oxidation (2206); forming a metal layer over the drain of the vertical structure (2208); and annealing the metal layer to form a silicide over the drain of the vertical structure (2210).

The operation 2204 may further include providing the vertical structure having a hard mask over the drain for protecting a top of the drain. The operation of shrinking the source and the channel by oxidation may further include: forming a first oxide layer over the vertical structure; forming a nitride layer over the first oxide layer; forming a second oxide layer over the nitride layer; performing CMP on the first oxide layer and the second oxide layer and stopping at a portion of the nitride layer; etching the nitride layer and the first oxide layer to expose the drain; forming a spacer adjacent to the drain; etching the first oxide layer to expose the channel and the source; shrinking the source and the channel substantially without shrinking the drain covered by the hard mask and the spacer; removing the spacer; and removing oxidized portions of the source and the channel.

The method 2200 may further includes: forming silicide over the source; forming a first interlayer dielectric over the source; forming a high-k dielectric layer over the channel; forming a metal gate layer over the high-k dielectric layer; forming a second interlayer dielectric over the metal gate layer; and forming an etch stop layer to cover a portion of the sidewall of the drain.

The operation 2204 may further include providing the source, the channel, and the drain to have the same width of about 10-20 nanometers. The operation 2206 may further include shrinking the source and the channel to have the same width of about 4-10 nanometers. The operation 2208 may further include forming a metal layer over a top of the drain of the vertical structure. The operation 2210 may further include annealing the metal layer to form silicide over the top of the drain of the vertical structure. The operation 2208 may further include forming a metal layer over a top and a sidewall of the drain of the vertical structure. The operation 2210 may further include annealing the metal layer to form silicide over the top and the sidewall of the drain of the vertical structure.

According to an exemplary embodiment, a semiconductor device is provided. The semiconductor device includes: a substrate; a vertical device over the substrate and having a drain; and a silicide over a top and a sidewall of the drain of the vertical structure.

According to an exemplary embodiment, a method of forming a vertical structure is provided. The method includes the following operations: providing a substrate; providing the vertical structure having a drain over the substrate; forming a metal layer over a top and a sidewall of the drain of the vertical structure; and annealing the metal layer to form silicide over the top and the sidewall of the drain of the vertical structure.

According to an exemplary embodiment, a method of forming a vertical structure is provided. The method includes the following operations: providing a substrate; providing the vertical structure having a source, a channel, and a drain over the substrate; shrinking the source and the channel by oxidation; forming a metal layer over the drain of the vertical structure; and annealing the metal layer to form a silicide over the drain of the vertical structure.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a vertical structure, comprising:
   providing a substrate;
   providing the vertical structure having a source, a channel, and a drain over the substrate;
   shrinking the source and the channel by oxidation;
   forming a metal layer over the drain of the vertical structure; and
   annealing the metal layer to form a silicide over the drain of the vertical structure;
   wherein shrinking the source and the channel by oxidation includes:
      forming a first oxide layer over the vertical structure,
      forming a nitride layer over the first oxide layer, the nitride layer including an upper horizontal portion and a lower horizontal portion,
      forming a second oxide layer over the nitride layer,
      performing CMP on the first oxide layer and the second oxide layer and the upper portion of the nitride layer, and stopping at the lower horizontal portion of the nitride layer, and
      etching the lower horizontal portion of the nitride layer and a portion of the first oxide layer to expose the drain.

2. The method of claim 1, wherein providing the vertical structure having the source, the channel, and the drain over the substrate further comprises providing the vertical structure having a hard mask over the drain for protecting a top of the drain.

3. The method of claim 1, wherein shrinking the source and the channel further includes:
   forming a spacer adjacent to the drain;
   etching the first oxide layer to expose the channel and the source;
   shrinking, by oxidation, the source and the channel substantially without shrinking the drain covered by the spacer;
   removing the spacer; and
   removing oxidized portions of the source and the channel.

4. The method of claim 1, further comprising:
   forming silicide over the source;
   forming a first interlayer dielectric over the source;
   forming a high-k dielectric layer over the channel;
   forming a metal gate layer over the high-k dielectric layer;
   forming a second interlayer dielectric over the metal gate layer; and
   forming an etch stop layer to cover a portion of the sidewall of the drain.

5. The method of claim 1, wherein forming the metal layer over the drain of the vertical structure further comprises forming a metal layer over a top and a sidewall of the drain of the vertical structure.

6. The method of claim 5, wherein annealing the metal layer to form silicide over the drain of the vertical structure further comprises annealing the metal layer to form silicide over the top and the sidewall of the drain of the vertical structure.

7. The method of claim 1, wherein, before the shrinking, the source and the channel are as wide as the drain, and the shrinking leaves an oxidation portion on side surfaces of the source and the channel.

8. The method of claim 7, further comprising:
   removing the oxidized portions of the source and the channel, leaving the source and the channel narrower than the drain.

9. The method of claim 8, further comprising forming:
   a silicide layer over a horizontal surface of the source;
   a first interlayer dielectric layer over the silicide layer;
   a high-k dielectric layer over the first interlayer dielectric layer;
   a metal gate layer over the high-k dielectric layer;
   a second interlayer dielectric over the metal gate layer; and
   an etch stop layer that overlies a vertical surface of the drain.

10. The method of claim 9, wherein a horizontal surface of the high-k dielectric layer overlies a horizontal surface of the source, and a vertical surface of the high-k dielectric layer overlies a vertical surface of the source.

11. The method of claim 10, wherein a horizontal surface of the metal gate layer overlies a horizontal surface of the high-k dielectric layer, and a vertical surface of the metal gate layer overlies a vertical surface of the high-k dielectric layer.

12. The method of claim 11, wherein a horizontal surface of the second interlayer dielectric overlies a horizontal surface of the metal gate layer, and a vertical surface of the second interlayer dielectric layer overlies a vertical surface of the metal gate layer.

13. The method of claim 11, further comprising, after the forming of the etch stop layer:
   etching back the etch stop layer to expose a portion of the sidewall of the drain.

14. The method of claim 1, wherein the vertical structure is a first vertical structure, the drain is a first drain, and the method further comprises:
   providing, over the substrate, a second vertical structure having a second drain and a third vertical structure having a third drain.

15. The method of claim 14, further comprising:
   forming the metal layer over the second drain and the second drain, such that the annealing of the metal layer forms a continuous silicide layer that extends over the first, second and third drains.

16. The method of claim 15, further comprising:
   removing a section, of the silicide layer, that is between the second and third drains.

17. The method of claim 4, wherein a horizontal surface of the high-k dielectric layer overlies a horizontal surface of the source, and a vertical surface of the high-k dielectric layer overlies a vertical surface of the source.

18. The method of claim 17, wherein a horizontal surface of the metal gate layer overlies the horizontal surface of the high-k dielectric layer, and a vertical surface of the metal gate layer overlies the vertical surface of the high-k dielectric layer.

19. The method of claim 18, wherein a horizontal surface of the second interlayer dielectric overlies the horizontal surface of the metal gate layer, and a vertical surface of the second interlayer dielectric layer overlies the vertical surface of the metal gate layer.

20. A method comprising:
   providing, over a substrate, a vertical structure having a source, a channel, and a drain;
   shrinking the source and the channel by oxidation;
   forming a metal layer over the drain of the vertical structure; and annealing the metal layer to form a silicide over the drain of the vertical structure;

wherein shrinking the source and the channel comprises:
  forming a first oxide layer over the vertical structure,
  forming a nitride layer over the first oxide layer,
  forming a second oxide layer over the nitride layer,
  performing CMP on the first oxide layer and the second oxide layer and stopping at a portion of the nitride layer,
  etching the nitride layer and the first oxide layer to expose the drain,
  forming a spacer adjacent to the drain,
  etching the first oxide layer to expose the channel and the source,
  shrinking the source and the channel substantially without shrinking the drain covered by the spacer,
  removing the spacer, and
  removing oxidized portions of the source and the channel.

* * * * *